(12) United States Patent
Morito

(10) Patent No.: US 6,545,801 B2
(45) Date of Patent: Apr. 8, 2003

(54) SEMICONDUCTOR OPTICAL AMPLIFIER PERFORMING POLARIZATION-INDEPENDENT OPERATION

(75) Inventor: Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/960,400

(22) Filed: Sep. 24, 2001

(65) Prior Publication Data

US 2002/0067541 A1 Jun. 6, 2002

(30) Foreign Application Priority Data

Dec. 1, 2000 (JP) ........................................ 2000-367727

(51) Int. Cl.⁷ .............................. H01S 3/25; H01S 3/10; H01L 29/06
(52) U.S. Cl. ........................... 359/344; 257/18; 257/21; 257/432; 372/44
(58) Field of Search .......................... 359/344; 372/43, 372/44; 257/13, 18, 21, 432

(56) References Cited

U.S. PATENT DOCUMENTS

| | | | | |
|---|---|---|---|---|
| 5,117,469 A | * | 5/1992 | Cheung et al. | 385/11 |
| 5,488,507 A | * | 1/1996 | Nishimura | 359/344 |
| 5,579,155 A | * | 11/1996 | Kitamura | 359/344 |
| 5,732,179 A | * | 3/1998 | Caneau et al. | 385/131 |
| 5,841,802 A | * | 11/1998 | Whiteley et al. | 372/45 |
| 5,848,085 A | * | 12/1998 | Nitta | 372/45 |
| 5,946,336 A | * | 8/1999 | Mizutani et al. | 372/50 |
| 5,982,531 A | * | 11/1999 | Emery et al. | 359/344 |
| 6,014,250 A | * | 1/2000 | Granestrand | 359/344 |
| 6,175,446 B1 | * | 1/2001 | Alphonse | 359/344 |
| 6,310,720 B1 | * | 10/2001 | Walker et al. | 359/344 |

* cited by examiner

Primary Examiner—Nelson Moskowitz
(74) Attorney, Agent, or Firm—Armstrong, Westerman, & Hattori, LLP

(57) ABSTRACT

A semiconductor optical amplifier includes a plurality of active layers of bulk crystal with at least one intervening spacer for optical amplification, wherein each of the active layers accumulates a tensile strain therein.

14 Claims, 17 Drawing Sheets

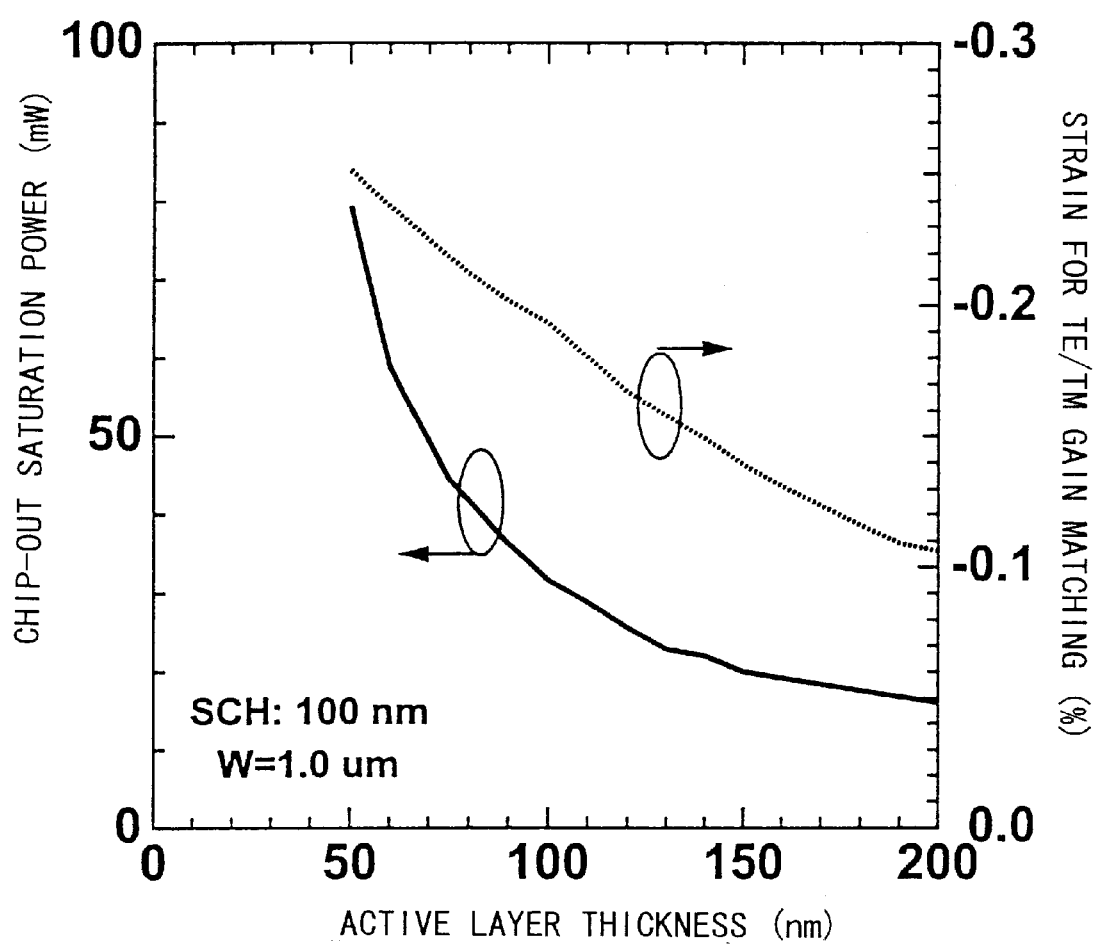

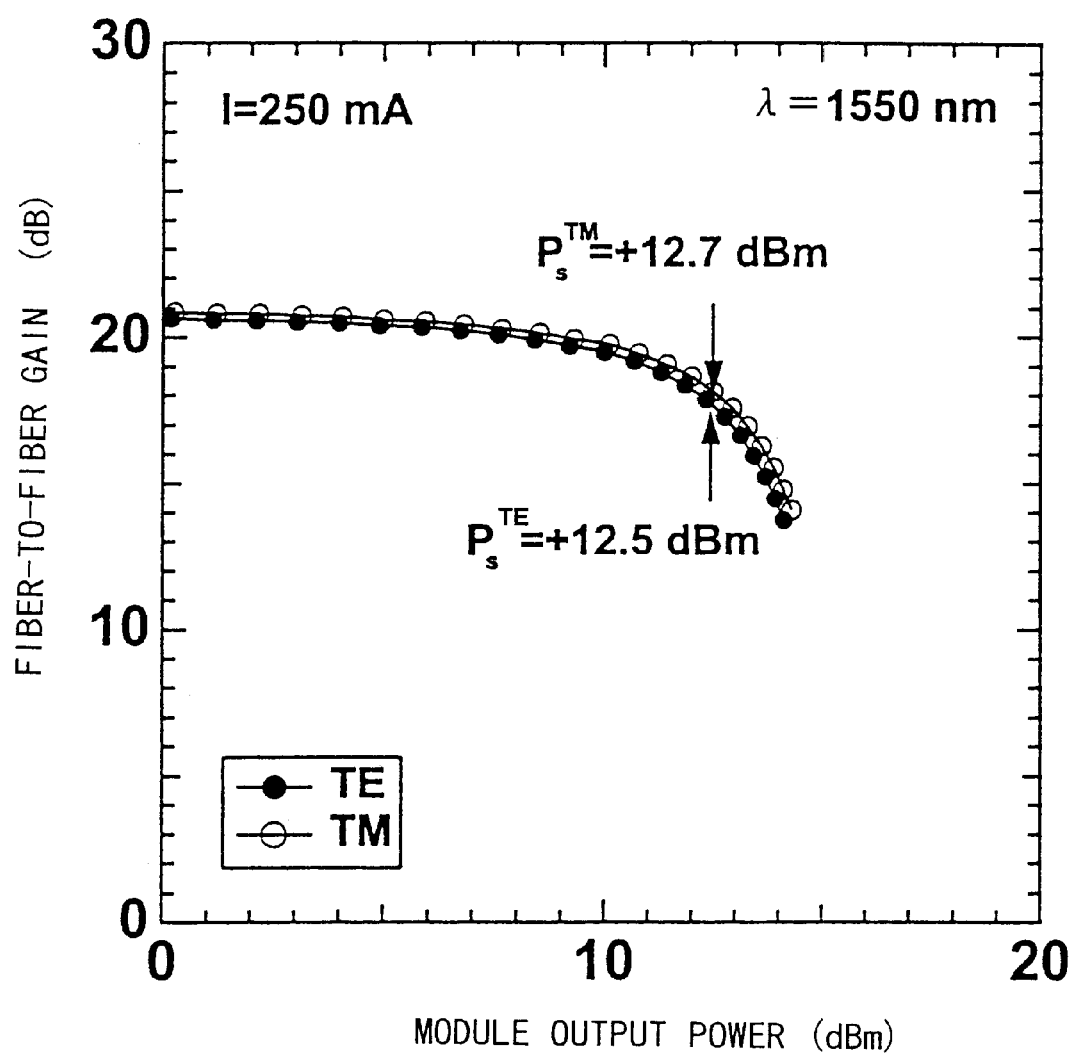

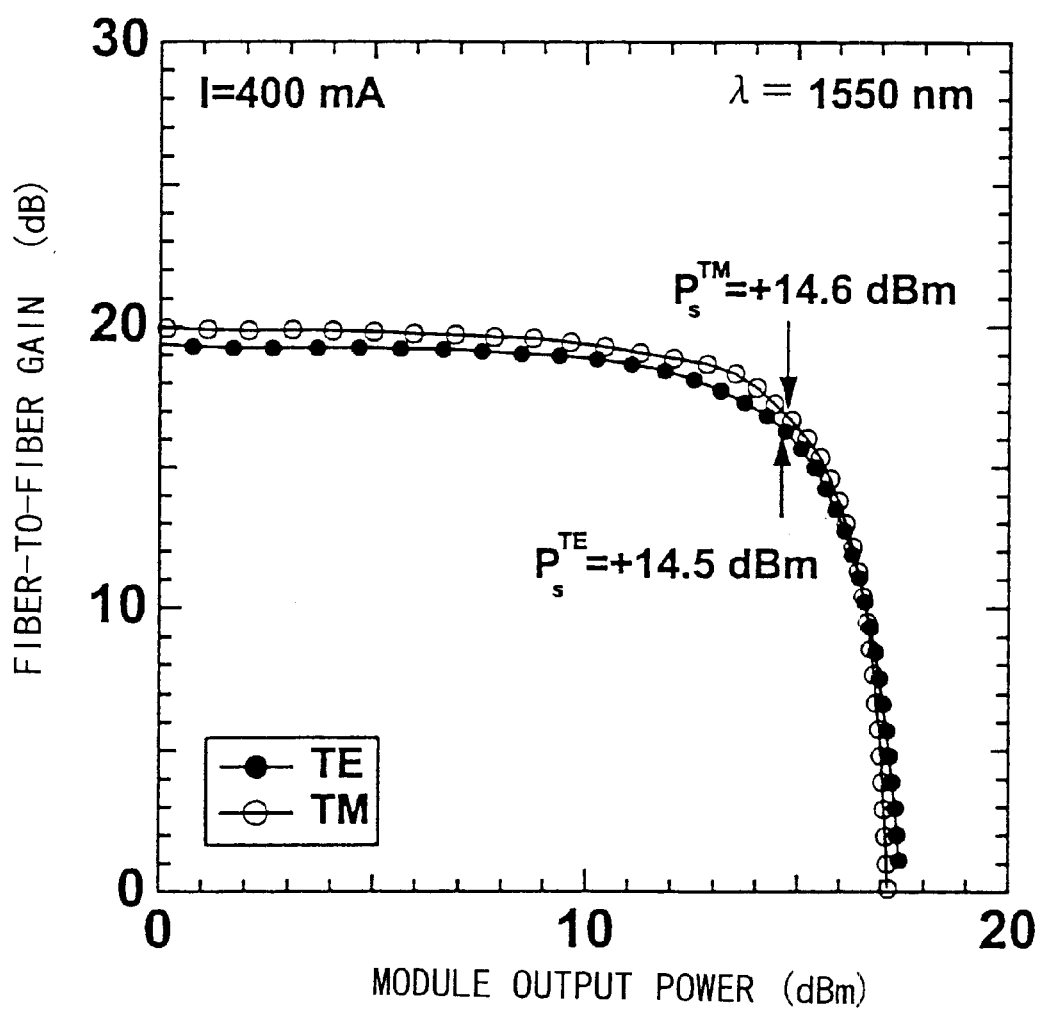

SEMICONDUCTOR OPTICAL AMPLIFIER PERFORMING POLARIZATION-INDEPENDENT OPERATION

CROSS-REFERENCE TO RELATED APPLICATION

The present application is based on Japanese priority application No.2000-367727 filed on Dec. 1, 2000, the entire contents of which are hereby incorporated by reference.

BACKGROUND OF THE INVENTION

This invention generally relates optical semiconductor devices and more particularly to a semiconductor optical amplifier.

An optical-fiber telecommunication system uses an optical amplifier for amplifying optical signals. In recent optical-fiber telecommunication systems that transmit wavelength-multiplexed optical signals, in which a large number of optical elements are used for synthesizing or dividing the optical signals, there is a need of providing a number of semiconductor optical amplifiers of low electric power consumption for compensating for the optical loss that is caused as a result of use of such a large number of optical elements.

In an optical fiber, an optical signal that is transmitted therethrough generally has a random polarization state. Thus, the semiconductor optical amplifier that is used for amplifying optical signals in such an optical fiber has to be a semiconductor optical amplifier of polarization-independent (polarization-dependence free) type.

FIGS. 1A and 1B show the construction of a typical conventional semiconductor optical amplifier 10.

Referring to FIG. 1A, the semiconductor optical amplifier 10 is formed on an n-type InP substrate 11 and has a layered structure that resembles to the structure of a laser diode. Thus, a first cladding layer 12 of an n-type InP is formed on the substrate 11, and a first optical confinement layer 13 of undoped InGaAsP is formed on the first cladding layer 12. Further, an active layer 14 of undoped InGaAs is formed on the first optical confinement layer 13, and a second optical confinement layer 15 of undoped InGaAsP is formed on the active layer 14. Further, a second cladding layer 16 p-type InP and a contact layer 16A of p-type InGaAs are formed consecutively on the second optical confinement layer 15. Furthermore, a p-type electrode 17 is formed on the contact layer 16A and an n-type electrode 18 is formed to a bottom surface of the substrate 11.

Further, the semiconductor optical amplifier 10 has an input end and an output end respectively covered with anti-reflection films 10A and 10B. Thus, when an incident optical beam is introduced to the input end through the anti-reflection film 10A in the state in which a driving bias is applied across the electrodes 17 and 18, the incident optical beam undergoes optical amplification by stimulated emission as it is guided through the active layer 14 to the output end.

FIG. 1B shows the semiconductor optical amplifier 10 in an end view.

Referring to FIG. 1B, the layered structure formed on the substrate 11 and including the cladding layer 12, the optical confinement layer 13, the active layer 14 and the optical confinement layer 15 is subjected to an etching process, and there is formed a mesa stripe that extends in an axial direction of the optical amplifier 10. At both lateral sides of the mesa stripe, it can be seen that there are formed current confinement layers 11A and 11B of n-type InP and current confinement layers 11C and 11D of p-type InP.

When using such a semiconductor optical amplifier 10 in an optical-fiber telecommunication system, it is necessary that the optical amplification is obtained irrespective of the polarization state of the incident optical beam as noted previously. Further, the semiconductor optical amplifier for use in an optical-fiber telecommunication system is required to have a large dynamic range so as to be able to deal with large power fluctuation of the input optical signal. In order to meet for these requirements, the semiconductor optical amplifier 10 has to be able to provide a large fiber-coupled saturated optical power. It should be noted that the fiber-coupled saturation optical power is a quantity defined for the entire system including the semiconductor optical amplifier, an input optical fiber coupled to the semiconductor optical amplifier, an optical system cooperating with the input optical fiber, an output optical fiber coupled to the semiconductor optical amplifier and an optical system cooperating with the output optical fiber, and is defined, based on the fiber-to-fiber gain, in which the loss of the optical systems is taken into consideration, as the value of the fiber-coupled optical power that causes a drop of 3 dB in the fiber-to-fiber gain.

In the case of designing a polarization-independent optical semiconductor device based on the semiconductor optical amplifier 10, the simplest way would be to use a strain-free bulk crystal for the active layer 14 and set the thickness of the active layer 14 to be identical with the width thereof as shown in FIG. 2A, wherein it should be noted that FIG. 2A is an enlarged view showing a part of the mesa-stripe of FIG. 1.

With the construction of FIG. 2A, it should be noted that polarization-independent operation is guaranteed for the optical amplifier in view of the fact that the optical confinement factor becomes the same in the Te-polarization mode in which the electric field oscillates parallel to the surface of the active layer and in the Tm-polarization mode in which the electric field oscillates vertically to the the active layer ($\Gamma_{te}=\Gamma_{tm}$), and in view of the fact that the material gain becomes the same in the Te-polarization mode and in the Tm-polarization mode ($g_{te}=g_{tm}$). Because of this, the product of the optical confinement factor $\Gamma$ and the material gain g becomes the same in any of the two polarization modes ($\Gamma_{te} \cdot g_{te} = \Gamma_{tm} \cdot g_{tm}$), and this guarantees the above-noted polarization independent operation for the optical amplifier.

In the case the thickness of the active layer 14 is thus formed equally with the width in the semiconductor optical amplifier 10 of FIG. 1, on the other hand, it is necessary to form the active layer 14 to have a width of 0.5 $\mu$m or less in order to realize a fundamental-mode optical guiding. However, processing of the active layer to such a small size is difficult, and the production of such an optical amplifier has been difficult.

FIG. 3 shows the relationship between the chip-out saturation power represented in the left vertical axis and the thickness of the active layer 14 obtained by the inventor of the present invention. Further, FIG. 3 shows a tensile strain to be introduced into the active layer 14 for realizing the polarization independent operation for the optical amplifier. In FIG. 3, the optical confinement layers 13 and 15 are assumed to have the thickness of 100 nm in semiconductor optical amplifier 10 of FIG. 1, and the calculation was made by setting the width of the active layer 14 to 1.0 $\mu$m. The strain introduced into the active layer 14 will be explained later.

FIG. 3 is referred to.

In the case the thickness of the active layer 14 is decreased, it can be seen from FIG. 3 that the value of the chip-out saturation power of the semiconductor optical amplifier 10 is increased. This effect reflects the situation in which the saturated output Ps of semiconductor optical amplifier the 10, represented as $$Ps=(wd/\Gamma)*(h\nu)/(\tau g'), \quad \text{Eq.(1)}$$

is increased as a result of increase of the mode cross-sectional area (wd/$\Gamma$), which in turn is caused as a result of decrease of thickness d of the active layer 14 and further as a result of increase of the carrier lifetime $\tau$. In Eq.(1), it should be noted that w and d represent the width and thickness of the active layer 14 respectively, $\Gamma$ represents the optical confinement factor, h represents the Planck constant, $\nu$ represents the optical frequency, $\tau$ represents the carrier lifetime in the active layer 14, and g' represents the differential gain.

In Eq.(1), it should be noted that the value of the parameter d is decreased in the representation of the mode cross-sectional area wd/$\Gamma$ when the thickness d of the active layer is decreased. However, the optical confinement factor $\Gamma$ decreases more sharply with the decrease of the thickness d, and there occurs, as a whole, an increase in the cross-sectional area wd/$\Gamma$. Thereby, the saturated output Ps is increased. Also, in Eq.(1), carrier lifetime $\tau$ is represented in terms of carrier density N in the active layer 14, non-optical recombination coefficient A, optical recombination coefficient B and Auger recombination coefficient C as $$1/\tau = A + BN + CN^2. \quad \text{Eq.(2)}$$

With increase of the thickness d of the active layer 14, there occurs an increase of carrier density N for a given injection current density, and thus, there occurs a decrease of carrier lifetime $\tau$. Such a decrease of the carrier lifetime $\tau$ contributes to the increase of the saturated optical output power Ps. In Eq.(1), it should be noted that the differential gain g' decreases with increasing difference ($\lambda$s–$\lambda$p) between the wavelength $\lambda$s of the optical signal and the wavelength $\lambda$p of the gain peak wavelength $\lambda$p. In the case the thickness d of the active layer 14 is decreased, it should be noted that the wavelength $\lambda$p shifts in the direction of short wavelength as a result of the band-filling effect with the increase of carrier density N. As a result, there occurs an increase in the difference $\lambda$s–$\lambda$p and associated decreases of the differential gain g'.

Thus, it is possible to increase the saturated optical output power Ps, and hence the chip-out saturation power, also in the semiconductor optical amplifier such as the one shown in FIG. 2(B) in which a small thickness is used for the active layer 14 as compared with the width, by decreasing the thickness of active layer 14 as represented in FIG. 3.

On the other hand, such a decrease of the thickness d of the active layer 14 causes an increase of the optical confinement factor $\Gamma_{te}$ for the Te-polarization mode over the optical confinement factor $\Gamma_{tm}$ for the Tm-polarization mode ($\Gamma_{te} > \Gamma_{tm}$), and there occurs a large polarization dependence in the semiconductor optical amplifier with regard to the Te-polarization mode and with regard to the Tm-polarization mode. It has been known conventionally, that the desired, polarization-independent operation can be realized by introducing appropriate tensile strain into the active layer 14. According to such an approach, it is possible to set the material gain $g_{te}$ for the Te-polarization mode to be smaller than the material gain $g_{tm}$ for the Tm-polarization mode ($g_{te} < g_{tm}$), by introducing a tensile strain into the active layer 14. Thereby, it becomes possible to satisfy the condition of polarization-dependence free operation ($\Gamma_{te} \cdot g_{te} = \Gamma_{tm} \cdot g_{tm}$) at least approximately, while using such a flat active layer 14.

As explained previously, FIG. 3 shows, in the vertical axis at the right, the amount of the tensile strain that has to be introduced into the active layer 14 for realizing polarization-independent operation for the semiconductor optical amplifier 10 of Figure, for the case in which the optical confinement layers 13 and 15 are formed to have a thickness of 100 nm and the active layer 14 is formed to have the width of 1.0 $\mu$m while changing the thickness of the active layer 14 variously. From FIG. 3, it can be seen that a tensile strain of about 0.2% is necessary in the case the active layer 14 has a thickness of 100 nm. In the case the thickness is 75 nm, on the other hand, it can be seen that the necessary strain is 0.23%. In the case the thickness of the active layer 14 is 50 nm, a tensile strain of 0.25% is necessary. In FIG. 3, it should be noted that the negative strain value represents that the strain is a tensile strain.

FIGS. 4–7 show the gain saturation characteristics of the semiconductor optical amplifier designed according to the foregoing principle, wherein FIG. 4 shows the gain saturation characteristics of the optical semiconductor amplifier 10 of FIG. 1 for the case in which a tensile strain of 0.2% (–0.2%) is introduced into the active layer 14 having a thickness d of 100 nm. FIG. 5, on the other hand, shows the gain saturation characteristics of the semiconductor optical amplifier 10 of FIG. 1 for the case in which a tensile strain of 0.23% (strain of –0.23%) is introduced to the active layer 14 that has the thickness d of 75 nm. FIG. 6, on the other hand, shows the gain characteristics of the semiconductor optical amplifier 10 of FIG. 1 for the case in which a tensile strain of 0.25% (strain of –0.25%) is introduced into the active layer 14 having the thickness d of 50 nm. In FIG. 4–6, it should be noted that the horizontal axis represents the module output optical power while the vertical axis represents the fiber-to-fiber gain of semiconductor optical amplifier 10. Defining the fiber-coupled saturation optical power as the module output optical power that provides a drop of 3 dB for the fiber-to-fiber gain, it can be seen from FIGS. 4–6 that the fiber-coupled saturation optical power takes a value of +12.5 dBm, +14.5 dBm, and +17.0 dBm at the wavelength of 1550 nm respectively for the case in which the active layer 14 has a thickness 100 nm, 75 nm and 50 nm.

As can be seen from FIGS. 4–6, the gain difference between the Te-polarization mode and the Tm-polarization mode is reduced to substantially zero, by introducing the tensile strain into the active layer 14 with an amount explained previously, and a substantially polarization-independent operation is realized for the semiconductor optical amplifier 10.

Thus, in view of the result of FIGS. 4–6, the gain difference between the Te-polarization mode and the Tm-polarization mode is successfully reduced to substantially zero for the optical signals having a wavelength in the vicinity of 1550 nm. However, due to the fact that a large strain is introduced into the active layer 14, the foregoing effect of suppressing the gain difference between the different modes is not effective when the wavelength of the optical signals to be amplified is deviated from the foregoing optimum range. In such a case, therefore, the polarization-independent operation is not obtained.

FIGS. 7–9 shows the gain difference $\Delta G$ between the Te-polarization mode and the Tm-polarization mode of the semiconductor optical amplifier 10 obtained for a wavelength range of 1500 nm–1600 nm, wherein FIG. 7 shows the case of setting the thickness d of the active layer 14 to 100 nm and setting the tensile strain to 0.2%, while FIG. 8 shows the case of setting the thickness d of the active layer 14 to 75 nm and setting the tensile strain to 0.23%. Further, FIG. 9 shows the case of setting the thickness d of the active layer 14 to 50 nm and setting the tensile strain to 0.25%.

FIGS. 7–9 are referred to.

It can be seen that the gain difference ΔG between the polarization states is very small in the vicinity of the optical wavelength of 1550 nm. On the other hand, when the optical wavelength to be amplified is deviated in the direction of longer wavelength, it can be seen that there appears a substantial gain difference. Moreover, it can be seen that the increase of the gain difference ΔG between the polarization states is enhanced in the case the thickness d of the active layer 14 is small. For example, in the case the thickness d of the active layer 14 is set to 100 nm, the gain difference ΔG between the Te-polarization mode and the Tm-polarization mode is about −1.1 dB at the wavelength of 1590 nm as for as shown in FIG. 7, while the gain difference ΔG between the Te-polarization mode and the Tm-polarization mode wavelength reaches a level of 1.5 dB at the wavelength of 1590 nm in the event the thickness d of active layer 14 is reduced to 50 nm as shown in FIG. 9.

In an optical-fiber telecommunication system, the technology of wavelength multiplexing is used for transmitting a large traffic of optical information. Because of this, the spectrum range of the optical signals that are transmitted through an optical-fiber telecommunication system is increasing. Recently, in particular, there is an attempt to extend the transmission band of the optical signals to a longer wavelength side from the conventional 1.55 μm band (C band). Accordingly, the semiconductor optical amplifier for use in such a broadband optical fiber telecommunication system of future has to provide polarization-independent operation over a wide wavelength range. Further, such a semiconductor optical amplifier is required to have a large saturation gain. The conventional semiconductor optical amplifier explained with reference to FIG. 1 cannot meet for such a demand.

SUMMARY OF THE INVENTION

Accordingly, it is a general object of the present invention to provide a novel and useful semiconductor optical amplifier wherein the foregong problems are eliminated.

Another and more specific object of the present invention is to provide a polarization-independent optical semiconductor device that operates over a broad optical wavelength band.

Another object of the present invention is to provide a broadband polarization-independent optical semiconductor device that can be fabricated easily by using a bulk active, without the need of narrowing the pattern width of a mesa-stripe structure unrealistically.

Another object of the present invention is to provide a semiconductor optical amplifier, comprising:
 a substrate extending from a first end surface to a second end surface;
 a first cladding layer formed on said substrate with a first conductivity type;
 a plurality of active layers formed on said first cladding layer each having a bandgap smaller than a bandgap of said first cladding layer;
 at least one spacer layer interposed between said plurality of active layers and having a bandgap larger than said bandgap of said active layers;
 a second cladding layer formed on said substrate so as to cover said plurality of active layers and said at least one spacer layer;
 a first electrode injecting carriers to each of said plurality of active layers through said first cladding layer; and
 a second electrode injecting carriers to each of said plurality of active layers through said second cladding layer;
 each of said plurality of active layers accumulates a tensile strain therein.

Another object of the present invention is to provide a wavelength-multiplexed optical telecommunication system comprising:
 a plurality of optical sources having respective, mutually different wavelengths;
 a first optical coupler coupling said plurality of optical sources to a single optical fiber;
 a semiconductor optical amplifier provided in said optical fiber;
 a second optical coupler dividing an optical signal amplified by said semiconductor optical amplifier to a plurality of output optical fibers; and
 an optical detector coupled optically to each of said output optical fibers,
 said semiconductor optical amplifier comprising:
  a substrate extending from a first end surface to a second end surface;
  a first cladding layer formed on said substrate with a first conductivity type;
  a plurality of active layers formed on said first cladding layer each having a bandgap smaller than a bandgap of said first cladding layer;
  at least one spacer layer interposed between said plurality of active layers and having a bandgap larger than said bandgap of said active layers;
  a second cladding layer formed on said substrate so as to cover said plurality of active layers and said at least one spacer layer;
  a first electrode injecting carriers to each of said plurality of active layers through said first cladding layer; and
  a second electrode injecting carriers to each of said plurality of active layers through said second cladding layer;
  each of said plurality of active layers accumulates a tensile strain therein,
  an input end of said active layer being coupled optically to a first part of said single optical fiber,
  an output end of said active layer being coupled optically to a second part of said single optical fiber.

According to the semiconductor optical amplifier of the present invention, the problem of shift of the operational wavelength band of the semiconductor optical amplifier in a short wavelength direction associated with the quantum effect is successfully avoided by using a bulk crystal for the active layers, and an optical gain is obtained in the long wavelength band including the 1.55 μm band. By introducing tensile strain simultaneously, the desired polarization-independent operation is achieved. Further, by interposing the spacer layer between plural active layers, and by optimizing the thickness of the spacer layer, it becomes possible to set the ratio of the optical confinement factors between the Te-polarization mode of and the Tm-polarization mode to approximately 1, while maintaining a large saturation optical output power. In the present invention, it is possible to reduce magnitude of the tensile strain introduced into the active layer for realizing polarization dependent operation of the semiconductor optical amplifier 10.

In the semiconductor optical amplifier of the present invention, it is possible to form an active structure on the surface of the substrate by the plural active layers and the one or more spacer layers and to sandwich the active structure thus formed by a pair of optical confinement layers having a bandgap larger than the bandgap of the active layer. It is preferable that the spacer layer has a thickness of 100 nm or larger, while the spacer layer is preferable to have a thickness of 200 nm or smaller. Further, it is preferable that each of the plural active layers has a thickness exceeding 30 nm, while it is also preferable that each of the active layers has a thickness of 100 nm or less. Particularly, each of the plural active layers is desirable to have a thickness of about 40 nm. The plural active layers may accumulate therein a tensile strain of 0.18% or less. Further, each of the plural active layers is desirable to have a shape in which the width thereof decreases toward the incident end surface and also toward the exit end surface. Alternatively, each of the plural active layers may have a thickness that decreases toward the incident end surface and also toward the exit end surface. In the semiconductor optical amplifier, it is preferable that the plural active layers forms a stripe structure extending form the incident end surface to the exit end surface. Thereby, it is preferable that the stripe structure intersects obliquely with any of the incident end surface and the exit end surface. Further, it is preferable to provide an antireflection coating on the incident end surface and also on the exit end surface.

Other objects and further features of the present invention will become apparent from the following detailed description when read in conjunction with the attached drawings.

BRIEF DESCRIPTION OF THE DRAWINGS

FIG. 3 is a diagram showing operational characteristics of the conventional semiconductor optical amplifier;

FIG. 4 is another diagram showing operational characteristics of the conventional semiconductor optical amplifier;

FIG. 5 is a further diagram showing operational characteristics of the conventional semiconductor optical amplifier;

DETAILED DESCRIPTION OF THE INVENTION

FUNCTION

Figure 10:
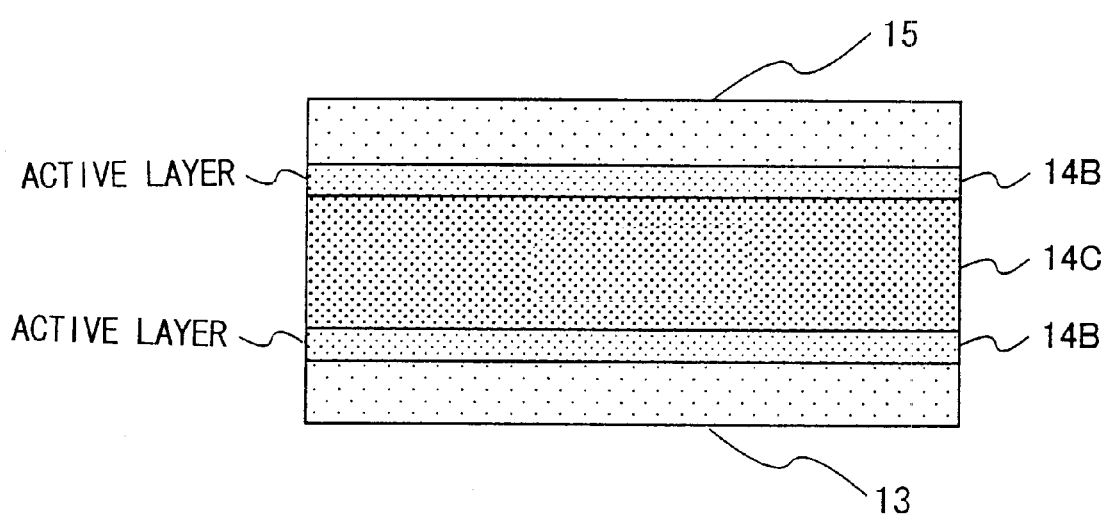
FIG. 10 is a diagram explaining the principle of the present invention.

FIG. 10 is a diagram showing the principle of the present invention, wherein those parts corresponding to the parts explained previously with reference to FIG. 1 are designated by the same reference numerals and the description thereof will be omitted.

Figure 1A:
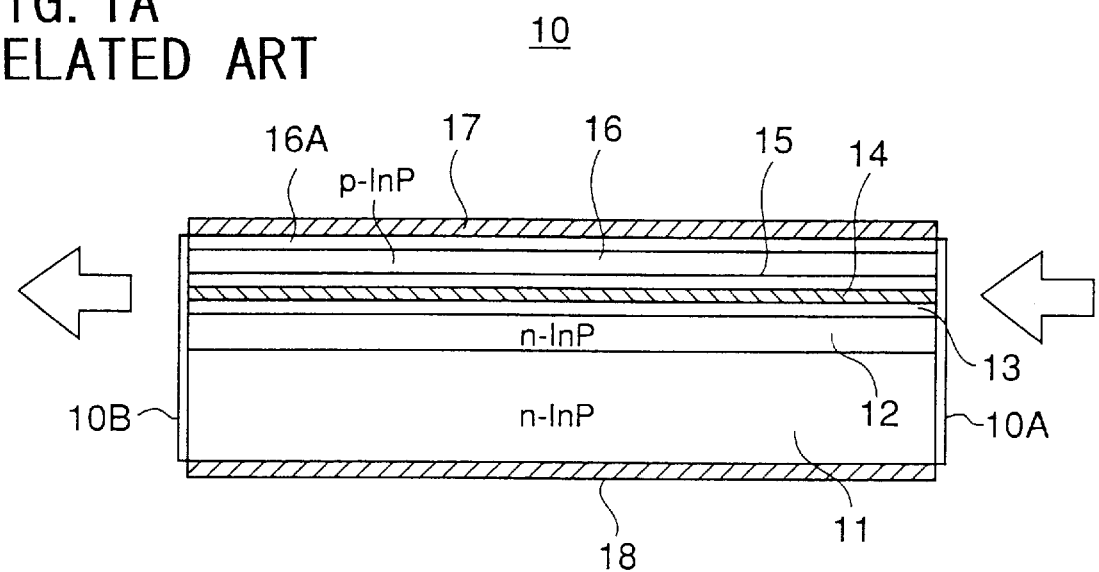
FIGS. 1A and 1B are diagrams showing the construction of a conventional semiconductor optical amplifier.
Figure 1B:
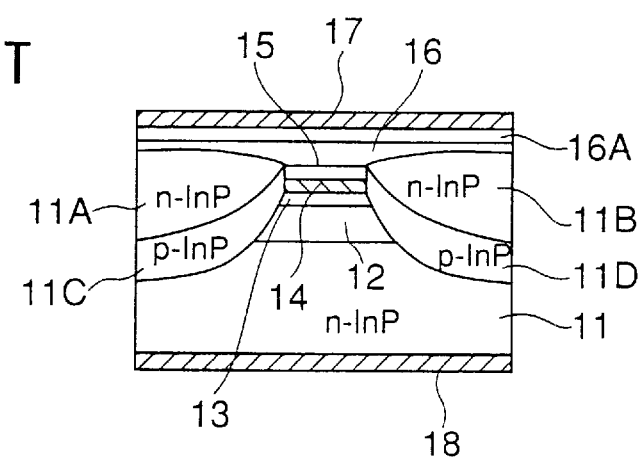
Figure 2A:
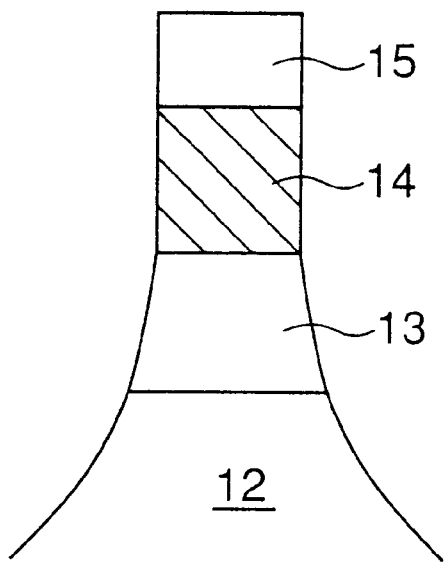
FIGS. 2A and 2B are cross-sectional diagrams showing possible design of a semiconductor optical amplifier based on the conventional semiconductor optical amplifier of FIGS. 1A and 1B.
Figure 2B:
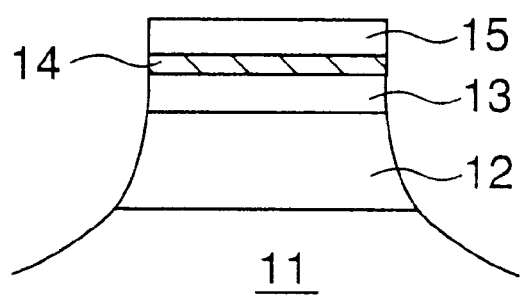

Referring to FIG. 10, two active layers 14A and 14B are provided in the semiconductor optical amplifier of the present invention in place of the single active layer 14 of FIG. 1, and a spacer layer 14C is interposed between the active layers 14A and 14B.

In the present invention, the two active layers 14A and 14B are formed of a bulk layer, and thus, no quantum levels are formed substantially in the active layers 14A and 14B. Even in the case a quantum level is formed, the energy difference between the fundamental level and the first quantum level is within the thermal energy kT due to the fact that the active layers 14A and 14B have a sufficiently large thickness. Thus, there appears no substantial quantum effect at the time of optical amplification caused in the active layers 14A and 14B by stimulated emission.

In the structure of FIG. 10, the two active layers 14A and 14B are optically coupled with each other via the spacer layer 14C, wherein the spacer layer 14C is formed at a location in which the optical electric field formed by the active layers 14A and 14B become maximum. In such a construction, the optical confinement factor changes in each of the active layers 14A and 14B by changing the thickness of the spacer layer 14C. Simultaneously to this, the ratio of optical confinement factors between the Te-polarization mode and the Tm-polarization mode is changed. Thus, by optimizing the thickness of the spacer layer 14C in the semiconductor optical amplifier that uses the structure of FIG. 10 as the active layer, it becomes possible to realize a polarization-independent operation over a wide wavelength range.

Figure 11:
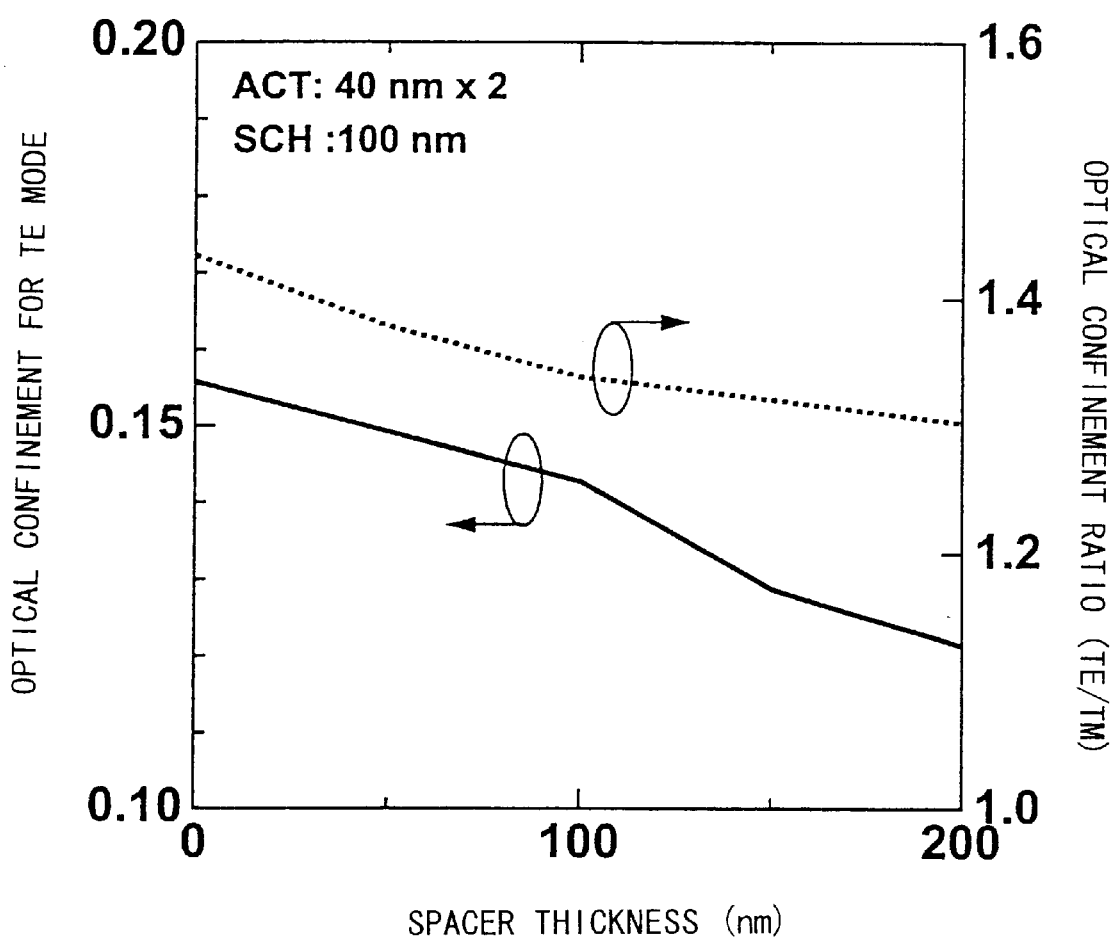
FIG. 11 is another diagram explaining the principle of the present invention.

FIG. 11 shows the optical confinement factor $\Gamma_{te}$ for the Te-polarization mode and further the ratio ($\Gamma_{te}/\Gamma_{tm}$) of the optical confinement factor $\Gamma_{te}$ for the Te-polarization mode to the optical confinement factor $\Gamma_{tm}$ for the Tm-polarization mode, as a function of the thickness of the spacer layer 14C, for the case in which each of the active layers 14A and 14B has a thickness of 40 nm in the structure of FIG. 10 and each of the optical confinement layers 13 and 15 has a thickness of 100 nm.

Referring to FIG. 11, it will be noted that the optical confinement factor $\Gamma_{te}$ decreases with increasing thickness of the spacer layer 14C, and associated therewith, there occurs an increase in the mode cross-sectional area explained previously in relation to Eq.(1). Further, the value of the ratio ($\Gamma_{te}/\Gamma_{tm}$) is decreased with increase of thickness of the spacer layer 14C. Thereby, it should be noted that the foregoing ratio is reduced to the value of 1.3 by forming the spacer layer 14C to the thickness of 200 nm. In the case no such a spacer layer 14C is formed, the ratio takes a value of about 1.4.

Figure 12:
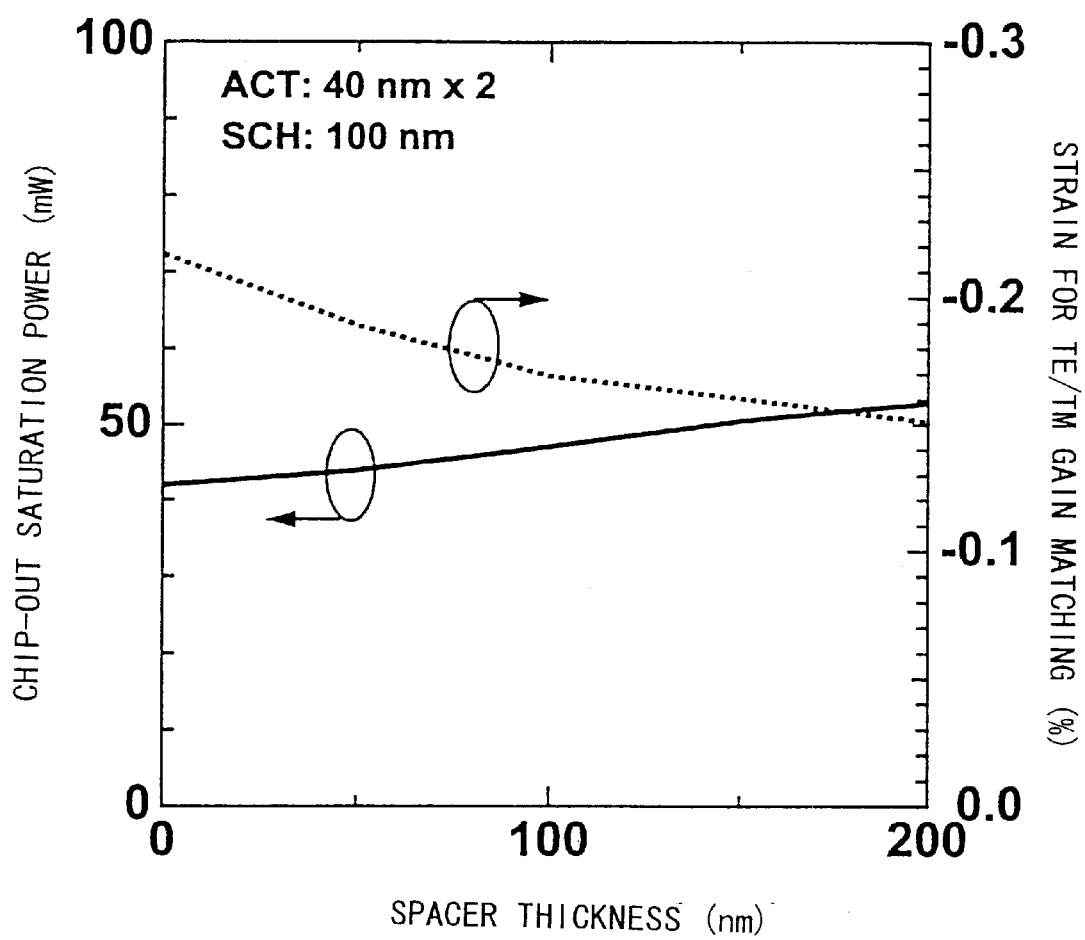
FIG. 12 is a further diagram explaining the principle of the present invention.

FIG. 12 shows the tensile strain that has to be introduced into the active layers 14A and 14B for satisfying the condition ($\Gamma_{te} \cdot g_{te} = \Gamma_{tm} \cdot g_{tm}$) of the polarization-independent operation of the semiconductor optical amplifier and the chip-out saturation optical power obtained when the foregoing condition is met, as a function of the thickness of the spacer layer 14C, wherein it should be noted that each of the active layers 14A and 14B has a thickness of 40 nm and each of the optical confinement layers 13 and 15 has a thickness of 100 nm. In FIG. 12, it should be noted that the vertical axis at the left represent the chip-out saturation optical power, while the vertical axis at the right shows the strain needed for matching the gain for the Te-polarization mode to the gain for the Tm-polarization mode.

Referring to FIG. 12, it can be seen that the chip-out saturation optical power increases with increasing thickness of the spacer layer 14C from the value of about 40 mW corresponding to the case in which no spacer layer 14C is provided, up to the value of about 200 nm, which corresponds to the case in which the spacer layer 14C is provided with the thickness of about 200 nm. It is believed that the increase of the mode cross-sectional area associated with the formation of the spacer layer 14C explained previously with reference to FIG. 11 contributes to this result.

Further, from FIG. 12, it can be seen that the amount of the tensile strain that has to be introduced into the active layers 14A and 14B for guaranteeing the polarization-independent operation of the semiconductor optical amplifier is successfully suppressed to 0.18% or less, by providing the spacer layer 14C having the thickness of 100 nm. When no such a spacer layer 14C is provided, it should be noted that the tensile strain exceeding 0.2% has to be introduced into the active layers 14A and 14B. Particularly, by interposing the spacer layer 14C with the thickness of 200 nm, it will be understood that the desired polarization-independent operation of the optical semiconductor device is achieved with a tensile strain of only 0.15%.

FIRST EMBODIMENT

Figure 13A:
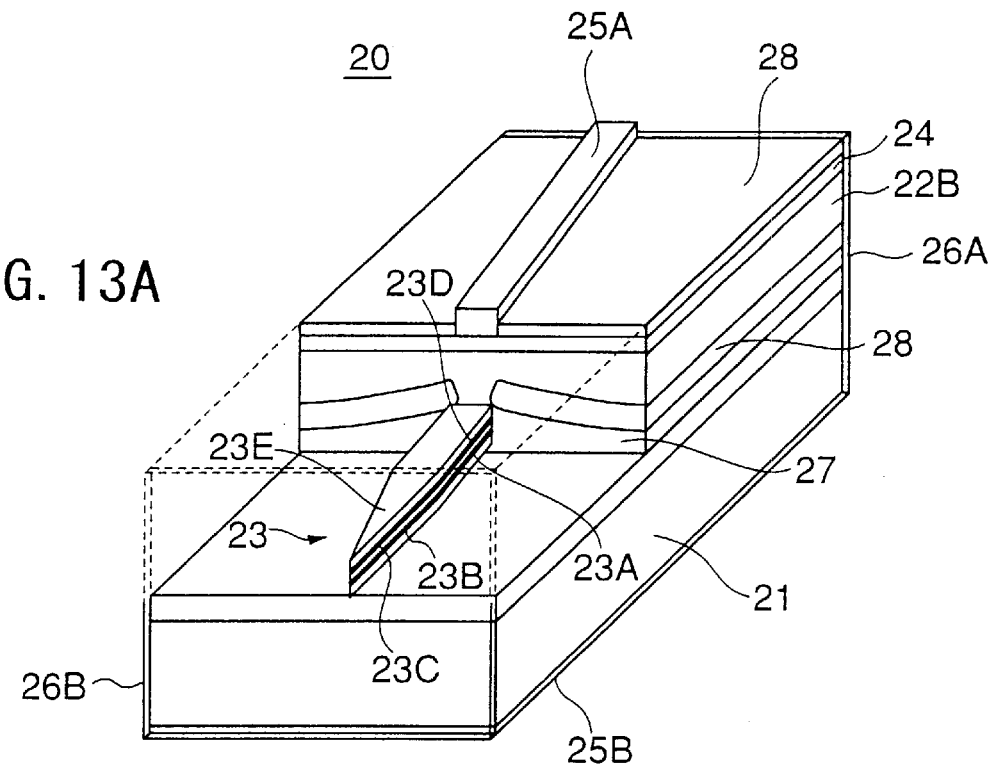
FIGS. 13A and 13B are diagrams showing the construction of a semiconductor optical amplifier according to a first embodiment of the present invention.
Figure 13B:
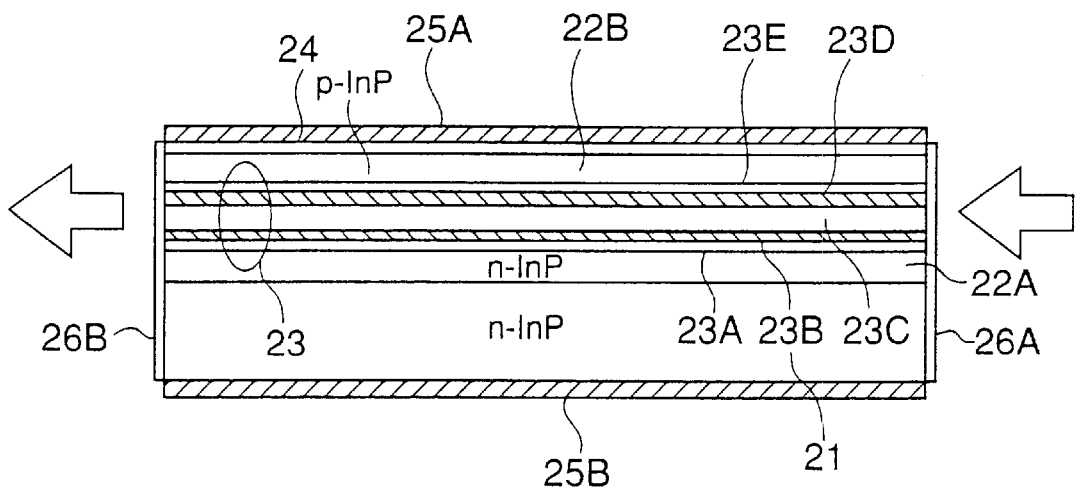

FIGS. 13A and 13B show the construction of a semiconductor optical amplifier 20 according to a first embodiment of the present invention, wherein FIG. 13A shows an oblique view in the state in which a part of the optical amplifier 20 is removed, while FIG. 13B shows a cross-sectional view of the semiconductor optical amplifier 20 taken in an axial direction thereof.

Referring to FIGS. 13A and 13B, the semiconductor optical amplifier 20 is formed on an n-type InP substrate 21 and includes a first cladding layer 22A of n-type InP formed epitaxially on the substrate 21 and an active structural part 23 formed on the first cladding layer 22A, wherein the active structural part 23 includes an optical confinement layer 23A of undoped InGaAsP formed epitaxially on the cladding layer 22A with a thickness of about 100 nm, a first active layer 23B of undoped InGaAs formed epitaxially on the optical confinement layer 23A with the thickness of 40 nm, a spacer layer 23C of undoped InGaAsP formed epitaxial on the first active layer 23B with a thickness consist of 100 nm, a second active layer 23D of undoped InGaAsP formed epitaxially on the spacer layer 23C with a thickness consists of 40 nm. Further, a second optical confinement layer 23E of undoped InGaAsP is formed on the second active layer 23D epitaxially with a thickness of 100 nm. The optical confinement layers 23A and 23E of InGaAsP and the spacer layer 23C of InGaAsP have a composition that achieves a lattice matching with respect to the InP substrate and is characterized by a bandgap wavelength of about 1.2 $\mu$m. On the other hand, the active layers 23B and 23D have a composition that accumulates a tensile strain of 0.18% with respect to the InP substrate 21.

On the optical confinement layer 23E, a second cladding layer 22B of p-type InP is formed epitaxially, and a p-type electrode 25A is formed on the p-type cladding layer 22B via a p-type InGaAs contact layer 24. Similarly, an n-type electrode 25B is formed on the bottom principal surface of the substrate 21.

Further, antireflection coatings 26A and 26B are formed on both end surfaces of the semiconductor optical amplifier 20.

As can be seen from the oblique view of FIG. 13A, it should be noted that the active structural part 23 is patterned on the cladding layer 22A so as to form a mesa stripe extending in the axial direction of the semiconductor optical amplifier 20, and a current confinement region 27 of p-type InP and a current confinement region 28 of n-type InP are formed at both lateral sides of the mesa stripe 23 by a regrowth process. It should be noted that the p-type cladding layer 22B is formed on the current confinement region 28 so as to make a contact with the optical confinement layer 23E in mesa stripe 23. Further, the part of the contact layer 24 not provided with the p-type electrode 25A is covered by a passivation film 28 of $SiO_2$ or SiN. In order to inject the carriers into the active structure 23 the p-type electrode 25A is formed on the contact layer 24 so as to extend parallel with the mesa stripe.

In a semiconductor optical amplifier, it is generally practiced to avoid laser oscillation by providing antireflection coatings such as the antireflection films 26A and 26B on the input end surface and on the output end surface aligned in the axial direction for eliminating optical feedback. In semiconductor optical amplifier 20 of FIGS. 13A and 13B, it should be further noted that the mesa stripe 23 is formed so as to extend in the direction forming an angle of about 7° with respect to the input end surface and the output end surface carrying thereon the antireflection coatings 26A and 26B. Thus, the optical feedback from the end surface to the active layer 23B or 23D is suppressed further.

Further, in the semiconductor optical amplifier 20 of FIGS. 13A and 13B, it should be noted that the width of the active structure 23 is narrowed toward the input end surface and the output end surface to form a tapered structure. Thereby, the efficiency of optical coupling between the semiconductor optical amplifier 20 and the optical fiber connected thereto and is improved.

Figure 6:
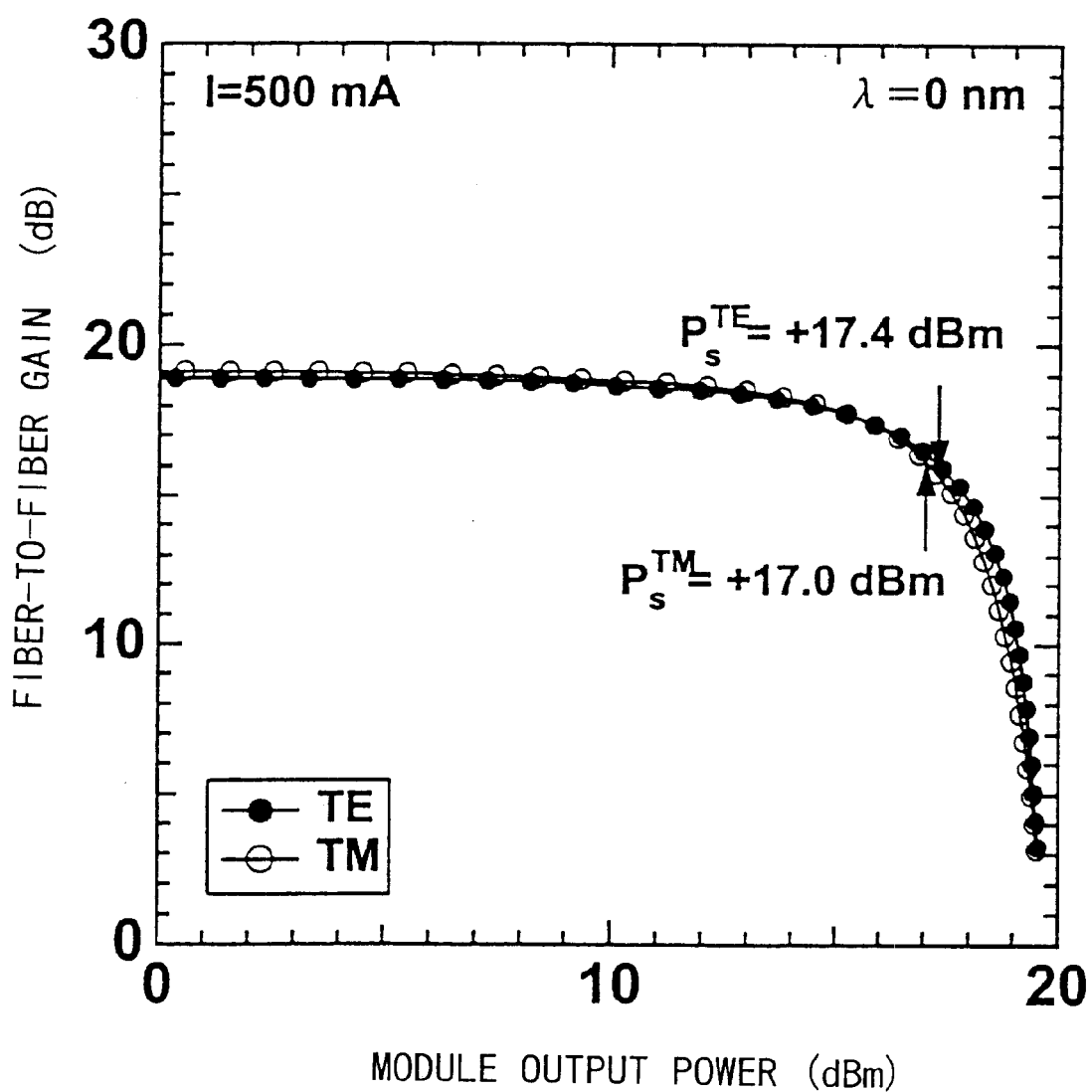
FIG. 6 is a further diagram showing operational characteristic of the conventional semiconductor optical amplifier.
Figure 14:
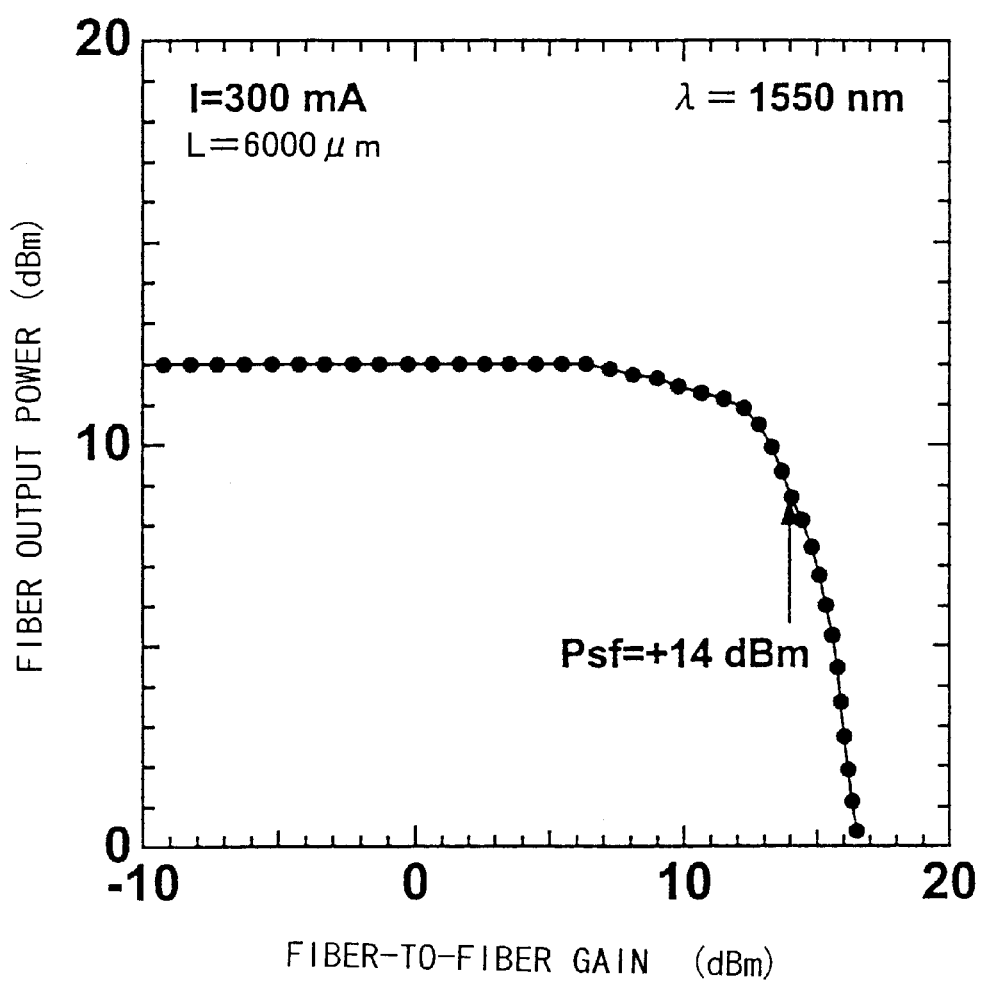
FIG. 14 is a diagram showing the operational characteristics of a semiconductor optical amplifier by according to the first embodiment of the present invention.

FIG. 14 shows the relationship between the fiber-to-fiber optical gain and the module output power similar to FIGS. 4–6 for the semiconductor optical amplifier 20 of FIGS. 13A and 13B for the case of amplifying an optical signal having a wavelength of 1550 nm. In FIG. 14, it is assumed that the active structure 23 has a length of 600 $\mu$m and the semiconductor optical amplifier 20 is driven with a drive current of 300 mA from a drive circuit (not shown) connected across the electrodes 25A and 25B.

Referring to FIG. 14, it can be seen that the Te/Tm-polarization mode dependence is eliminated entirely for the semiconductor optical amplifier 20 of FIGS. 13A and 13B with regard to the fiber-to-fiber gain-module output power and with regard to the gain saturation characteristics. Thus, the semiconductor optical amplifier 20 performs a polarization-independent optical amplification operation.

Figure 15:
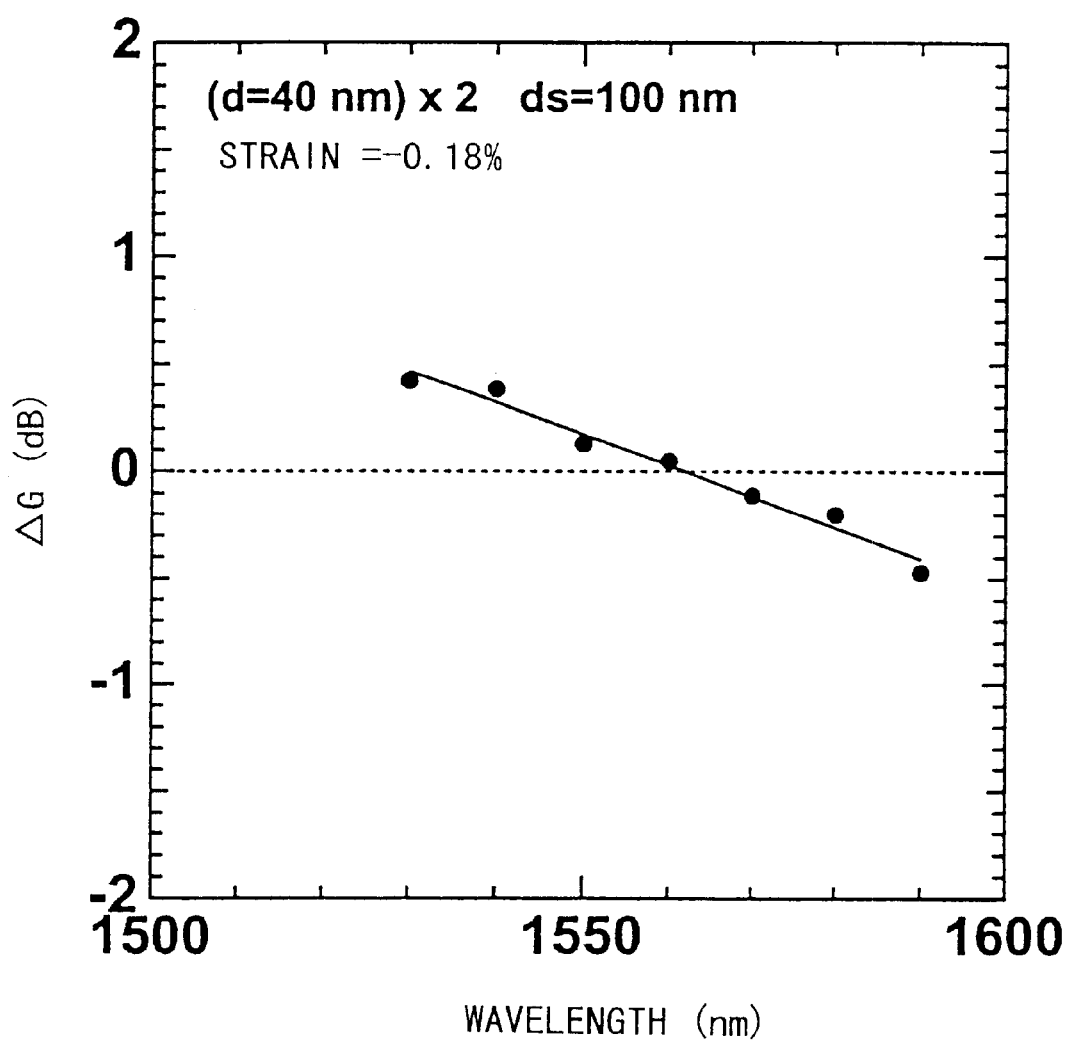
FIG. 15 is another diagram showing the operational characteristics of the semiconductor optical amplifier according to the first embodiment of the present invention.

FIG. 15 shows the relationship between the gain difference ΔG between the Te-polarization mode and the Tm-polarization mode in the semiconductor optical amplifier 20 of FIGS. 13A and 13B and the wavelength of the optical signals that are to be amplified.

Figure 7:
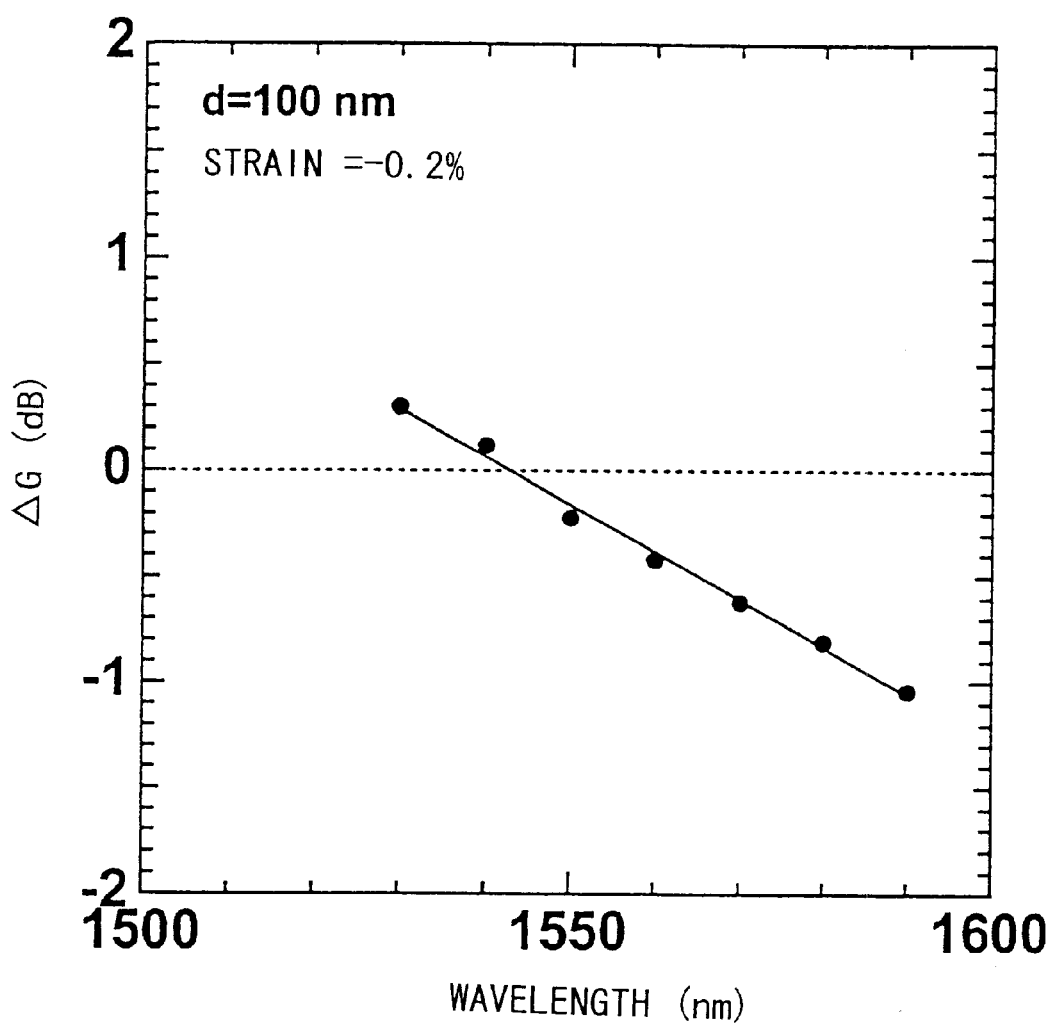
FIG. 7 is a diagram explaining the problem of the conventional semiconductor optical amplifier.
Figure 8:
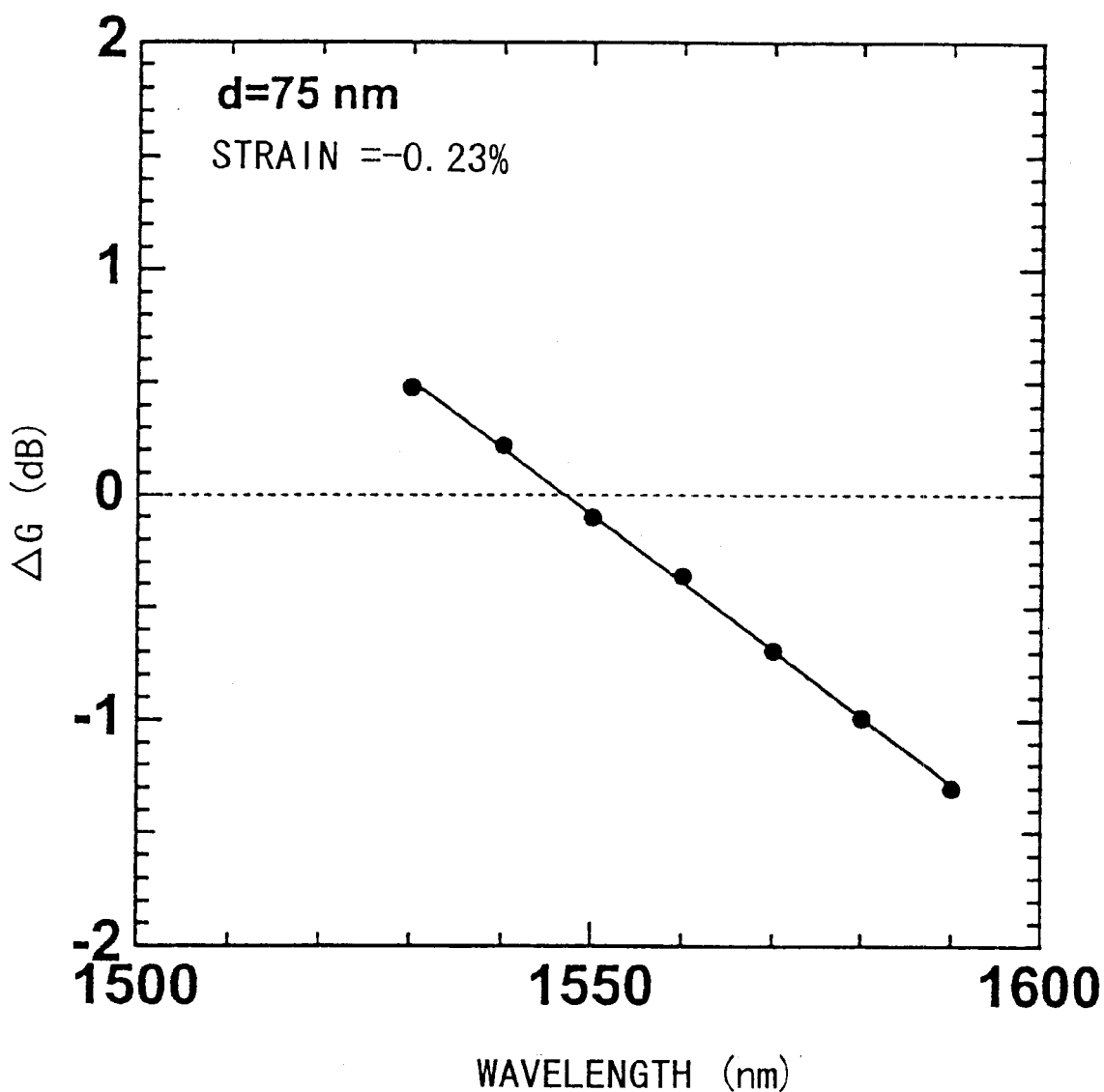
FIG. 8 is another diagram explaining the problem of the conventional semiconductor optical amplifier.
Figure 9:
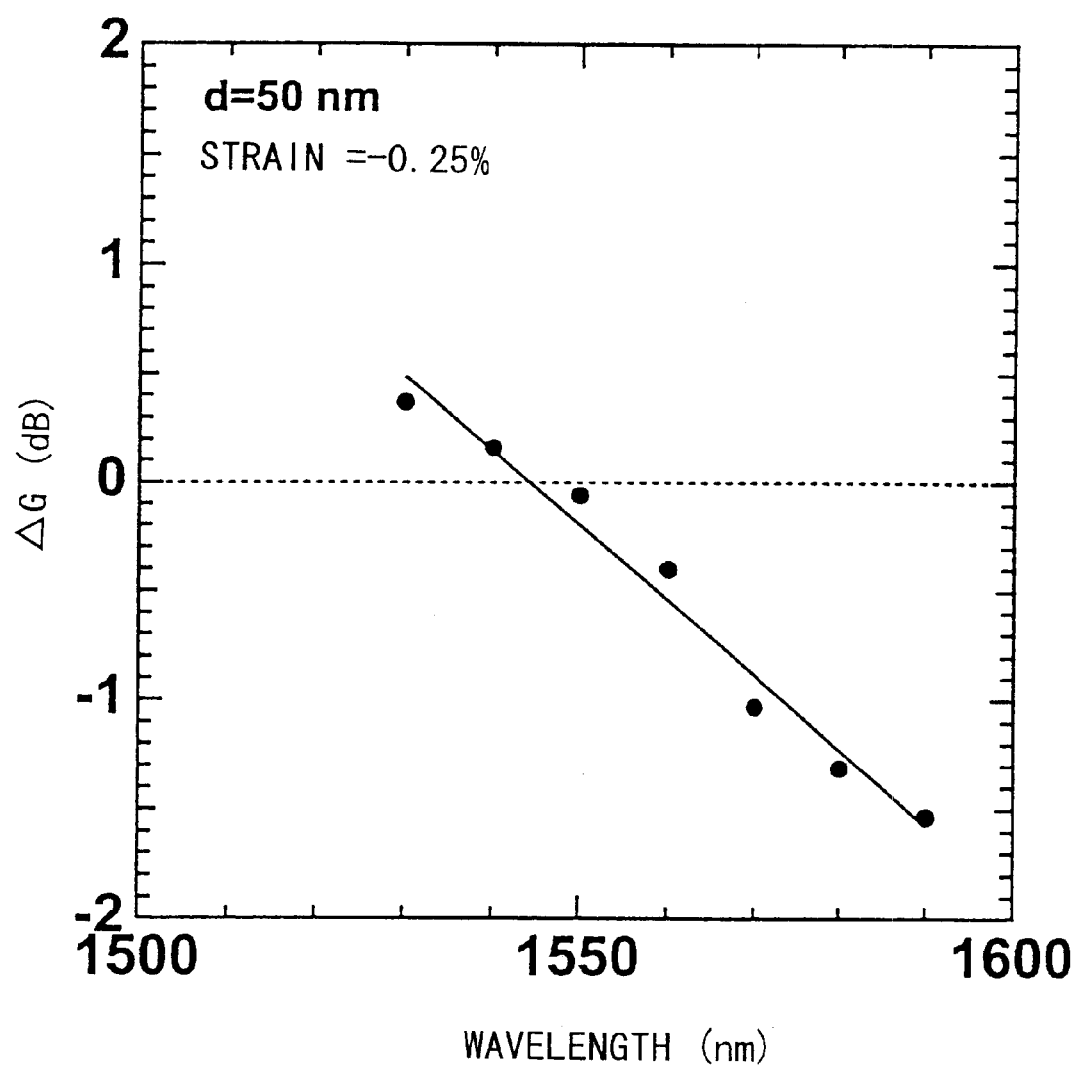
FIG. 9 is a further diagram explaining the problem of the conventional semiconductor optical amplifier.

Referring to FIG. 15. the wavelength dependence of the gain difference ΔG is decreased substantially as compared with FIGS. 7–9 representing the case of the semiconductor optical amplifier 10 of FIG. 1 in which the single active layer 14 is used. For example, the gain difference of +0.2 dB for the wavelength of 1550 nm changes only to about −0.5 dB at the wavelength of 1590 nm. This is a remarkable improvement over the conventional semiconductor optical amplifier 10 explained previously.

Thus, according to the present invention, by using plural bulk semiconductor active layers each accumulating a tensile strain therein together with one or more spacer layers of proper thickness interposed between the active layers, it becomes possible to suppress the wavelength dependence of the gain difference between different polarization states, while simultaneously maintaining a large fiber-coupled saturation optical power. By using such a semiconductor optical amplifier in an optical-fiber telecommunication system, it is becomes possible to amplify broadband optical signals including wavelength-multiplexed optical signals efficiently.

Figure 16:
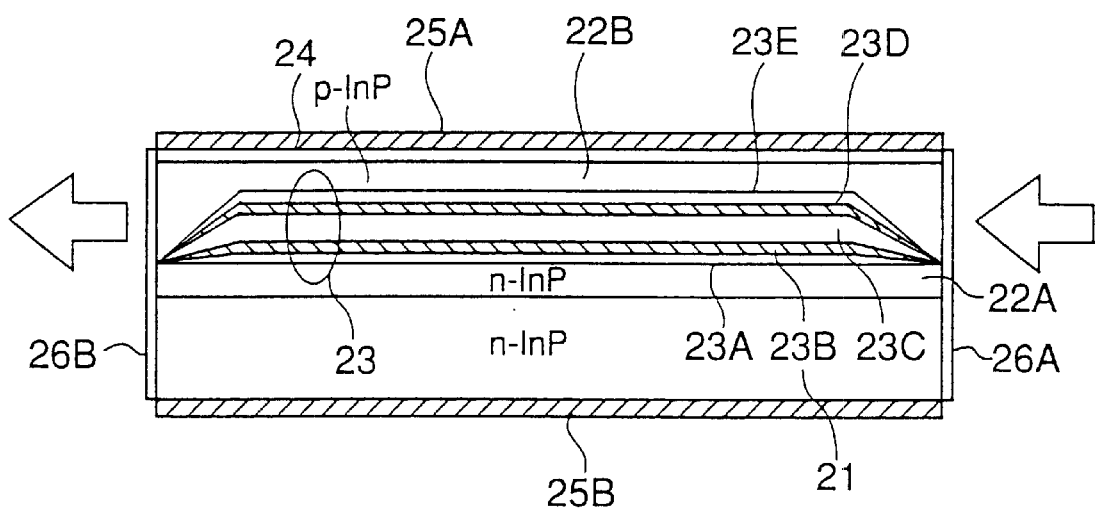
FIG. 16 is a diagram showing a modification of the semiconductor optical amplifier of the first embodiment.

Furthermore, as shown in FIG. 16, it is possible to decrease the thickness of the active structure 23 gradually in the vicinity of the input/output end surfaces carrying thereon the antireflection coatings 26A and 26B, in the semiconductor optical amplifier 20 of FIGS. 13A and 13B so as to form a tapered structure in the vertical cross-sectional view. It should be noted that such a tapered structure in the thickness direction can be formed easily by using a mask pattern having a width that changes gradually with the axial position of the semiconductor optical amplifier 20, during the process of forming the active structure 23 by an MOVPE process or MBE process.

SECOND EMBODIMENT

Figure 17:
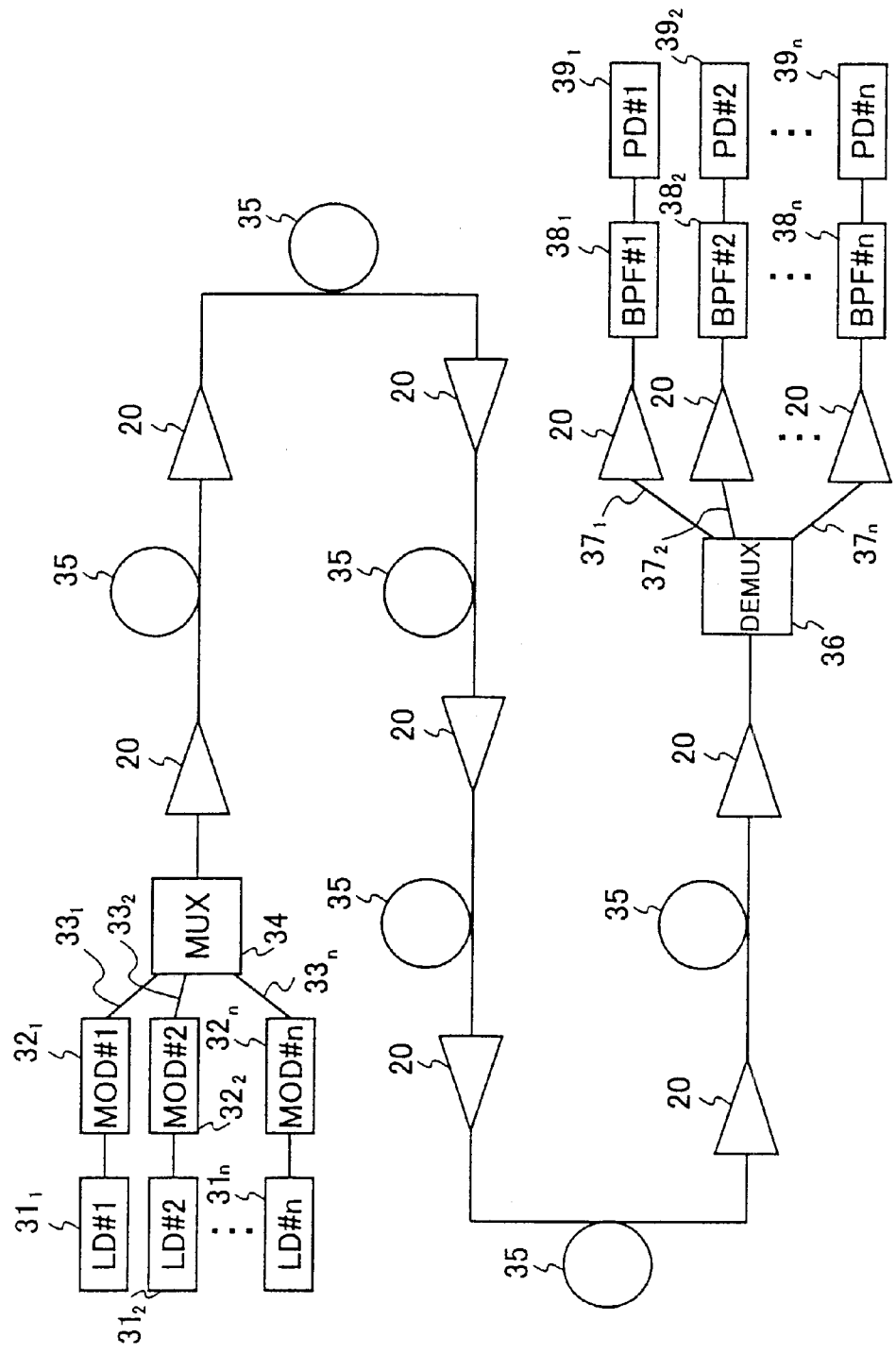
FIG. 17 is a diagram showing the construction of a wavelength multiplexing optical-fiber telecommunication system according to a second embodiment of the present invention.

FIG. 17 shows the construction of a wavelength-multiplexed optical telecommunication system according to a second embodiment of the present invention that uses the semiconductor optical amplifier 20 of FIGS. 13A and 13B.

Referring to FIG. 17, each of the optical beams formed by laser diodes $31_1$–$31_n$ having respective, different oscillation wavelengths is modulated by any of corresponding optical modulators $32_1$–$32_n$, and optical signals of respective wavelengths are formed. The optical signals thus formed are forwarded to a multiplexer 34 formed of optical couplers through respective optical fibers $33_1$–$33_n$. The multiplexer 34 is connected in a trunk optical fiber 35, and the optical signals thus formed are transmitted in the form of wavelength-multiplexed optical signal.

The wavelength-multiplexed optical signal thus was formed is transmitted through the trunk optical fiber 35 to an optical coupler 36 while being amplified by the semiconductor optical amplifiers 20 having the construction each explained with reference to FIGS. 13A and 13B and provided in the optical fiber 35 at a predetermined interval.

In optical coupler 36, the wavelength-multiplexed signal in the trunk optical fiber 35 is branched into respective optical fibers $37_1$–$37_n$, wherein the optical loss at the time of the optical branching is compensated for by the semiconductor optical amplifiers 20 in each of the optical fibers $37_1$–$37_n$.

Further, the optical signals are extracted from the wavelength-multiplexed signal thus amplified optically in the optical fibers $37_1$–$37_n$, by causing to pass the wavelength-multiplexed optical signal through optical filters $38_1$–$38_n$. The optical signals thus detected are detected by corresponding optical detectors $39_1$–$39_n$.

As it explained previously, by using the semiconductor optical amplifier 20 for optical amplification in such an optical-fiber telecommunication system, it becomes possible to carry out polarization-independent (polarization-dependence free) optical amplification over a wide wavelength band corresponding to a wavelength-multiplexed signal with a large saturation gain.

Further, the present invention is by no means limited to the embodiments described heretofore, but various variations and modifications may be made without departing from the scope of the present invention.

What is claimed is:

1. A semiconductor optical amplifier, comprising:
   a substrate extending from a first end surface to a second end surface;
   a first cladding layer formed on said substrate with a first conductivity type;
   a plurality of active layers formed on said first cladding layer each having a bandgap smaller than a bandgap of said first cladding layer;
   at least one spacer layer interposed between said plurality of active layers and having a bandgap larger than said bandgap of said active layers;
   a second cladding layer formed on said substrate so as to cover said plurality of active layers and said at least one spacer layer;
   a first electrode injecting carriers to each of said plurality of active layers through said first cladding layer; and
   a second electrode injecting carriers to each of said plurality of active layers through said second cladding layer;
   each of said plurality of active layers accumulates a tensile strain therein.

2. A semiconductor optical amplifier as claimed in claim 1, wherein said plurality of active layers and said at least one spacer layer form an active layer structure, and wherein said active layer structure is sandwiched on said substrate by a pair of optical confinement layers having a bandgap lager than a bandgap of said active layers.

3. A semiconductor optical amplifier as claimed in claim 2, wherein said pair of optical confinement layers have a composition identical with said spacer layer.

4. A semiconductor optical amplifier as claimed in claim 1, wherein said spacer layer has a thickness of 100 nm or more.

5. A semiconductor optical amplifier as claimed in claim 1, wherein said spacer layer has a thickness of 200 nm or less.

6. A semiconductor optical amplifier as claimed in claim 1, wherein each of said plurality of active layers has a thickness exceeding 30 nm.

7. A semiconductor optical amplifier as claimed in claim 1, wherein each of said plurality of active layers has a thickness of 100 nm or less.

8. A semiconductor optical amplifier as claimed in claim 1, wherein each of said plurality of active layers has a thickness of about 40 nm.

9. A semiconductor optical amplifier as claimed in claim 1, wherein each of said plurality of active layers accumulates therein a tensile strain of 0.18% or less.

10. A semiconductor optical amplifier as claimed in claim 1, wherein each of said plurality of active layers has a width that decreases toward said first end surface and said second end surface.

11. A semiconductor optical amplifier as claimed in claim 1, wherein each of said plurality of active layers has a thickness that decreases toward said first end surface and said second end surface.

12. A semiconductor optical amplifier as claimed in claim 1, wherein each of said plurality of active layers form a stripe structure extending from said first end surface to said second end surface, said stripe structure crossing obliquely to each of said first and second end surfaces.

13. A semiconductor optical amplifier as claimed in claim 1, wherein each of said first and second end surfaces carries thereon an antireflection coating.

14. A wavelength-multiplexed optical telecommunication system comprising:

a plurality of optical sources having respective, mutually different wavelengths;

a first optical coupler coupling said plurality of optical sources to a single optical fiber;

a semiconductor optical amplifier provided in said optical fiber;

a second optical coupler dividing an optical signal amplified by said semiconductor optical amplifier to a plurality of output optical fibers; and an optical detector coupled optically to each of said output optical fibers, said semiconductor optical amplifier comprising:

a substrate extending from a first end surface to a second end surface;

a first cladding layer formed on said substrate with a first conductivity type;

a plurality of active layers formed on said first cladding layer each having a bandgap smaller than a bandgap of said first cladding layer;

at least one spacer layer interposed between said plurality of active layers and having a bandgap larger than said bandgap of said active layers;

a second cladding layer formed on said substrate so as to cover said plurality of active layers and said at least one spacer layer;

a first electrode injecting carriers to each of said plurality of active layers through said first cladding layer; and a second electrode injecting carriers to each of said plurality of active layers through said second cladding layer;

each of said plurality of active layers accumulates a tensile strain therein, an input end of said active layer being coupled optically to a first part of said single optical fiber, an output end of said active layer being coupled optically to a second part of said single optical fiber.

* * * * *